US008118169B2

(12) United States Patent
Hosoi et al.

(10) Patent No.: US 8,118,169 B2
(45) Date of Patent: Feb. 21, 2012

(54) RETAINER AND SUBSTRATE STORAGE CONTAINER PROVIDED WITH SAME RETAINER

(75) Inventors: Masato Hosoi, Itoigawa (JP); Takayuki Nakayama, Itoigawa (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 0 days.

(21) Appl. No.: 12/921,411

(22) PCT Filed: Apr. 10, 2009

(86) PCT No.: PCT/JP2009/057341
§ 371 (c)(1),
(2), (4) Date: Sep. 8, 2010

(87) PCT Pub. No.: WO2009/131016
PCT Pub. Date: Oct. 29, 2009

(65) Prior Publication Data
US 2011/0000817 A1 Jan. 6, 2011

(30) Foreign Application Priority Data
Apr. 25, 2008 (JP) .................................. 2008-115667

(51) Int. Cl.
B65D 85/30 (2006.01)
(52) U.S. Cl. ...................................... 206/711; 206/454
(58) Field of Classification Search .................. 206/454, 206/710, 711, 722, 832; 211/41.18; 414/935–937, 414/939, 941
See application file for complete search history.

(56) References Cited

U.S. PATENT DOCUMENTS

| 5,228,568 | A  | * | 7/1993  | Ogino et al. ................... 206/711 |
| 5,782,362 | A  |   | 7/1998  | Ohori |
| 6,267,245 | B1 | * | 7/2001  | Bores et al. .................... 206/711 |
| 6,644,477 | B2 | * | 11/2003 | Bores et al. .................... 206/711 |
| 7,017,749 | B2 | * | 3/2006  | Yajima et al. .................. 206/711 |
| 7,523,830 | B2 |   | 4/2009  | Burns et al. |
| 2007/0295638 | A1 | * | 12/2007 | Nakatogawa ................. 206/711 |

FOREIGN PATENT DOCUMENTS
JP  1-92137 U  6/1989
(Continued)

OTHER PUBLICATIONS

English translation of the International Preliminary Report on Patentability mailed on Dec. 23, 2010, 6 pages.
(Continued)

Primary Examiner — Luan K Bui
(74) Attorney, Agent, or Firm — Osha • Liang LLP

(57) ABSTRACT

When the position of a substrate is shifted, the substrate is made to return to an original position by enabling the position of the substrate to be controlled using an elastic piece which protrudes inside from a vertical direction part of a frame. Further, a coupling piece is provided extending in a vertical direction and having both ends thereof coupled to a horizontal direction part of the frame, and a protruding part protruding inside a substrate container is provided on the coupling piece. Then, this protruding part is configured to have an inclined face which is inclined in a direction intersecting the substrate and enabled to come into contact with the periphery of the substrate, and thereby this inclined face guides the substrate to reduce the friction of the substrate and to control the position of the substrate.

5 Claims, 13 Drawing Sheets

FOREIGN PATENT DOCUMENTS

| | | |
|---|---|---|
| JP | 2002-353301 A | 12/2002 |
| JP | 2005-005525 A | 1/2005 |
| JP | 2005-320028 A | 11/2005 |

OTHER PUBLICATIONS

Abstract of Japanese Publication No. JP2005-320028, dated Nov. 17, 2005, data supplied from the espacenet database—Worldwide, 1 page.

Abstract of Japanese Publication No. JP2005-005525, dated Jan. 6, 2005, data supplied from the espacenet database—Worldwide, 1 page.

Abstract of Japanese Publication No. JP2002-353301, dated Dec. 6, 2002, data supplied from the espacenet database—Worldwide, 1 page.

International Search Report issued in PCT/JP2009/057341, mailed on Jun. 2, 2009, with translation, 4 pages.

\* cited by examiner

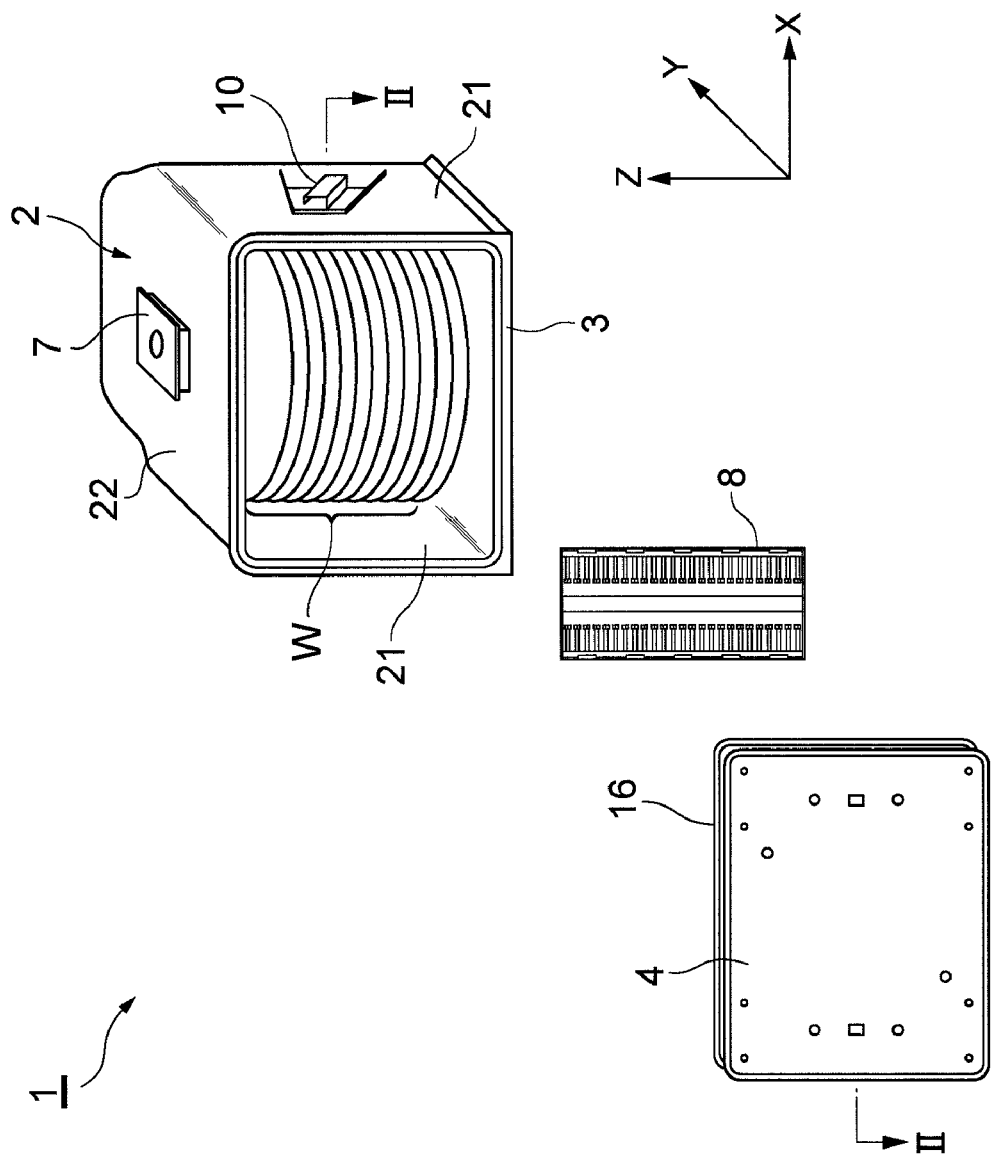

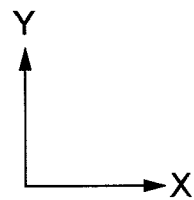
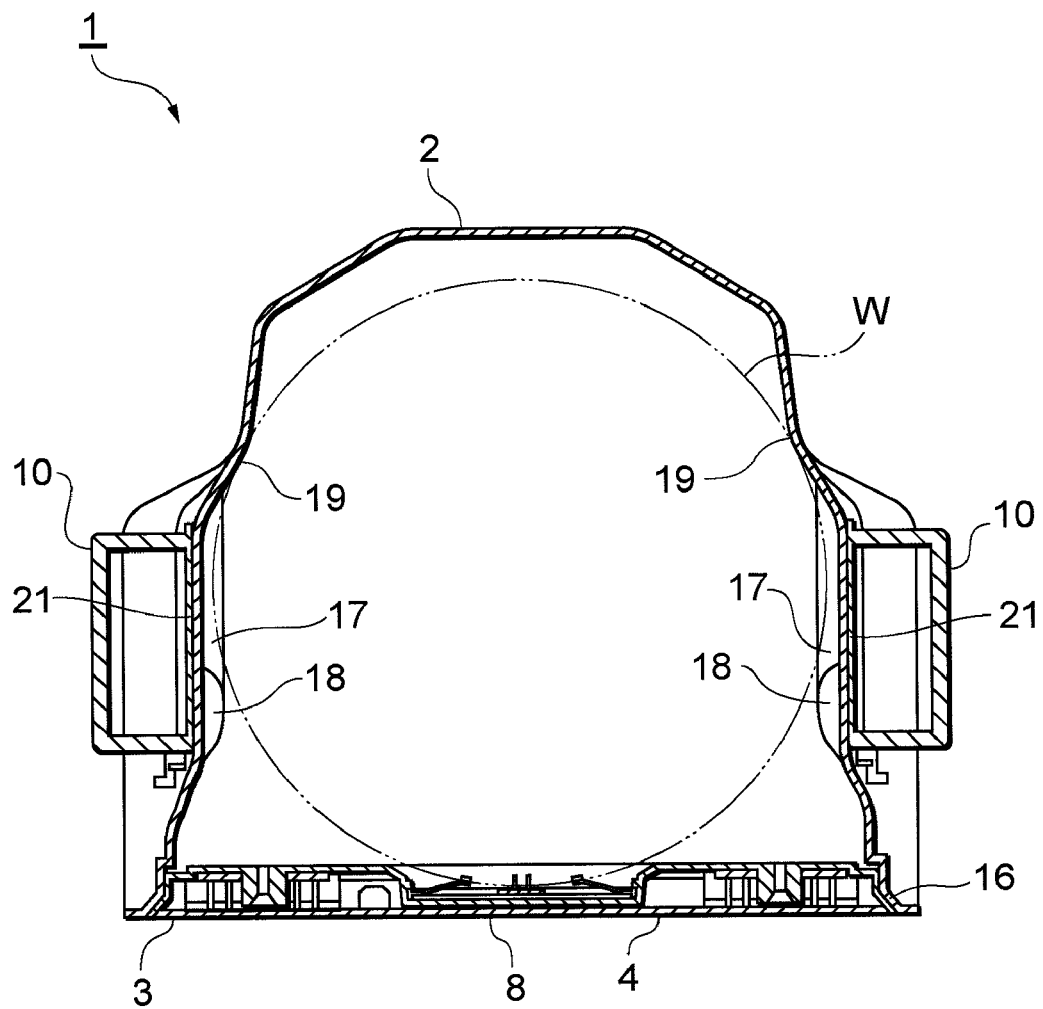

RETAINER AND SUBSTRATE STORAGE CONTAINER PROVIDED WITH SAME RETAINER

TECHNICAL FIELD

The present invention relates to a retainer retaining a substrate such as a semiconductor wafer, a mask glass, a mask glass with a pellicle, and a pellicle, and relates to a substrate container provided with the retainer.

BACKGROUND ART

The substrate containers disclosed in Patent documents 1 and 2 have been known as a substrate container used for substrate transportation. Such a substrate container includes a container main body which contains a substrate inside thereof and has an opening formed on the forward side front face, for example, a cover which enables the opening of this container main body to be opened and closed, and a retainer which is attached to the inside wall of this cover and retains the front periphery of the substrate to sandwich the substrate between the container main body and the retainer. On this retainer, plural elastic pieces each having a holding groove formed at the head for holding the substrate are provided in a pair for each substrate and this pair of elastic pieces is disposed along the substrate. Further, there are optional configurations such as one in which plural holding grooves are formed for one elastic piece and one in which another elastic piece and another holding groove are formed on the center side of the cover. In addition, the cover can be fitted into or removed from the container main body manually or by a cover opening and closing apparatus. In addition, the retainer is provided with a latch part such as a latch protrusion or a latch recess, for example. The retainer is fixed to the cover (or the container main body) by fitting the retainer latch part into a latch part of the counterpart.
Citation List
Patent Document
 Patent document 1: Japanese Patent Application Laid-Open Publication No. 2002-353301
 Patent document 2: Japanese Patent Application Laid-Open Publication No. 2005-320028

SUMMARY OF THE INVENTION

Problem to be Solved by the Invention

In the above conventional technique, when a large shock caused by dropping or the like is applied to the substrate container in automatic transferring by an apparatus or in manual transferring by an operator, for example, the elastic piece is considerably bent and the elastic piece moves in reaction, and there is a problem that the substrate runs off the holding groove to be broken or the substrate is contaminated with a particle generated in the friction between the substrate and the substrate container even if the substrate is not broken.

Further, while it is effective for a measure against such shock application to form the shape of the groove into V-shape and to make the depth of the groove deeper and the width of the groove narrower, there arises a problem, in this case, that larger friction is caused in the contact between the substrate and the holding groove resulting in easy substrate contamination or a problem that the substrate may be caught in the groove.

The present invention has been achieved for solving such a problem and aims for providing a retainer which can retain a substrate stably and can reduce the problem of the substrate contamination, and providing a substrate container including this retainer.

Means for Solving the Problem

A retainer of the present invention is the one provided to a substrate container containing a substrate, for retaining the substrates aligned and supported at regular intervals with a plate thickness direction in a vertical direction, the retainer comprising: a frame having a pair of vertical direction parts each extending in the vertical direction and a pair of horizontal direction parts each extending in a horizontal direction which intersects the pair of vertical direction parts; an elastic piece protruding inside from the vertical direction part and being capable of controlling a position of the substrate; a coupling piece extending in the vertical direction and having both ends thereof coupled to the horizontal direction parts; and a protruding part protruding inside the substrate container from the coupling piece and having an inclined face formed to be inclined in a direction intersecting the substrate and enabled to come into contact with a periphery of the substrate.

Such a retainer can control the position of the substrate with the elastic piece protruding inside from the vertical direction part of the frame and thereby can return the substrate to the original position with the elastic piece even when the position of the substrate is shifted. Further, the retainer is provided with the coupling piece which extends in the vertical direction and has both ends thereof coupled to the horizontal direction parts of the frame, and this coupling piece has the protruding part formed to protrude inside the substrate container. This protruding part is configured to have the inclined face which is inclined in the direction intersecting the substrate and enabled to come into contact with the periphery of the substrate, and thereby this inclined face can easily guide the substrate to reduce the friction of the substrate and to control the position of the substrate.

Further, the protruding part is preferably disposed between the substrates neighboring each other in the vertical direction, and the inclined faces include: a first inclined face formed on an upper end and enabled to come into contact with one of the substrates; and a second inclined face formed on a lower end and enabled to come into contact with the other substrate. Such a configuration can guide the two substrates neighboring each other in the vertical direction with using one protruding part disposed between the substrates.

Still further, the protruding parts are preferably provided on both sides of the substrate in the vertical direction, and the protruding parts provided on both sides of the substrate are disposed to form a space larger than a plate thickness of the substrate in the vertical direction. Such a configuration avoids the contact between the substrate and the protruding part in a normal state in which the substrates are aligned and disposed and allows the substrate to come into contact with the protruding part only when the substrate is shifted, resulting in reduction of the friction between the substrate and the protruding part and in suppression of the generation of particles.

Moreover, the protruding parts provided on both sides of the substrate are preferably disposed at the positions different from each other in the horizontal direction. Thereby, the substrate is not caught by the protruding parts provided on both sides of the substrate.

Further, the configuration may include a receiving part which protrudes outward from the coupling piece and is enabled to come into contact with a cover to which the frame is attached, for controlling the movement of the coupling piece. Here, the receiving part is preferably formed in the center of the coupling piece and preferably protrudes outside the frame on the wall side. Thereby, it is possible to control the movement of the coupling piece and to control the position of the protruding part.

Moreover, the substrate container according to the present invention comprises: a container main body having an opening and containing a substrate; a cover closing the opening; and the retainer attached to an inside wall of the container main body or the cover.

Such a substrate container can control the position of the substrate with the elastic piece protruding inside from the vertical direction part of the frame, and thereby can make the substrate to return to the original position with the elastic piece even when the position of the substrate is shifted. Further, the substrate container includes the coupling piece which extends in the vertical direction and has both ends thereof coupled to the horizontal direction parts of the frame, and the protruding part protruding inside the substrate container is formed on the coupling piece. This protruding part is configured to have the inclined face which is inclined in the direction intersecting the substrate and enabled to come into contact with the periphery of the substrate, and thereby this inclined face can easily guide the substrate to reduce the friction of the substrate and to control the position of the substrate.

ADVANTAGE OF THE INVENTION

The present invention can control the position of the substrate while reducing the friction of the substrate, and thereby can provide a retainer which can retain the substrate stably and reduce the problem of substrate contamination and can provide a substrate container including this retainer.

BRIEF DESCRIPTION OF DRAWINGS

FIG. 1 is a perspective exploded view of a substrate container according to a first embodiment of the present invention.

FIG. 2 is a transverse cross-sectional view taken along the line II-II of the substrate container shown in FIG. 1.

DESCRIPTION OF EMBODIMENTS

Figure 3:
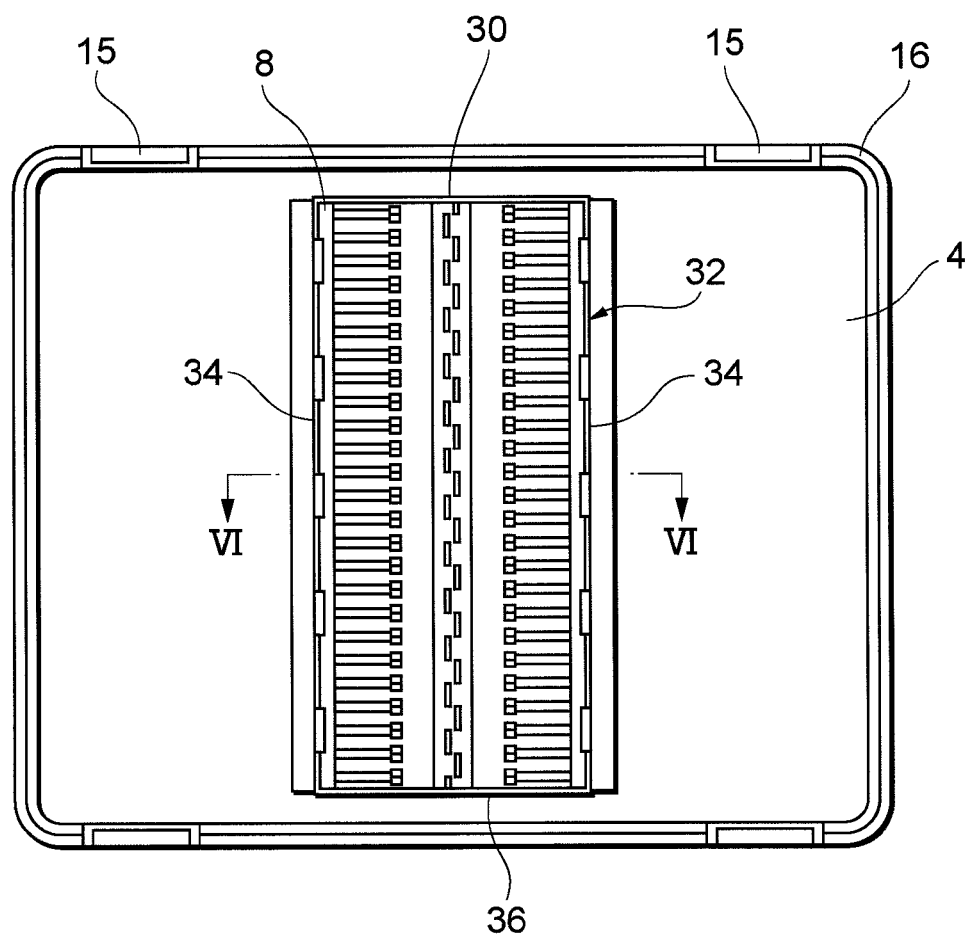
FIG. 3 is a rear view of a cover to which a retainer in FIG. 1 is attached.

In the following, preferable embodiments of a retainer according to the present invention and a substrate container provided with the retainer will be described with reference to the drawings. Note that, in the explanation of the drawings, the same or a corresponding element will be denoted by the same symbol and repeated explanation will be omitted. FIG. 1 is a perspective exploded view of a substrate container according to a first embodiment of the present invention, and FIG. 2 is a transverse cross-sectional view taken along the line II-II of the substrate container shown in FIG. 1.

The substrate container 1 shown in FIG. 1 and FIG. 2 contains one or more (e.g., 6, 13, or 25) substrates W, and is used for transportation, transferring, preservation, or the like of the substrate W. The substrate container 1 has an opening 3 which is formed at the front face and can input or output the substrate W in the forward and backward direction Y, and includes a container main body 2 aligning and containing the substrates W at regular intervals in the vertical direction Z and a cover 4 detachably inserted in the opening 3 of the container main body 2.

The cover 4 has a prescribed thickness in the forward and backward direction Y and includes a latch mechanism (lock mechanism) 15 disposed retreatably to be locked to a facing pair of peripheries of the opening 3. This latch mechanism 15 advances or retreats by an operation from the outside of the cover 4 and can lock the cover 4 inserted in the opening 3. Further, a seal gasket 16 (refer to FIG. 3) is mounted on the side wall periphery of the cover 4. By attaching the cover 4 mounting the seal gasket 16 to the opening 3 and locking the cover 4 with the latch mechanism 15, the inside of the substrate container 1 can be made to have a sealed state. Further, on the back side of the cover 4 (inside face of the substrate container), a retainer 8 is attached to horizontally support the plural substrates W aligned in the vertical direction. Note that the details of the retainer 8 will be described hereinafter.

The substrate W to be contained in the substrate container 1 is made of a disc-shaped silicon wafer having a diameter of, for example, 300 mm, and both sides of the substrate W are subjected to mirror-like finishing. The substrate W is input into or taken out from the container main body 2 in a state in which the periphery thereof is handled by a dedicated robot at the right and left sides. The periphery of the substrate W has a notch N (refer to FIG. 6) formed for facilitating determination and alignment of a crystal orientation. This notch N has a semicircular shape in a planar view, for example.

The container main body 2, the cover 4, a robotic flange 7, a handle 10, or the like in the substrate container 1 can be formed by using synthetic resin such as polypropylene, cycloolefin polymer, polycarbonate, polyethylene terephthalate, polybutylene terephthalate, polyether ether ketone, polyacetal, and polyetherimide, for example. These kinds of synthetic resin and thermoplastic elastomer may be added with an additive agent in an appropriate quantity such as an antistatic agent, a charge enhancing additive (carbon and metallic fiber), an ultraviolet light absorbent, and a stiffener (glass fiber and carbon fiber).

The container main body 2 is formed by using certain resin such as polycarbonate which is distinguished in high transparency and high stiffness. The container main body 2 has a front open box type which has an opening at the front. In the container main body 2, each inside face of both side walls 21 has teeth 17 formed for supporting the substrate W horizontally. These teeth 17 are arranged at an appropriate pitch in the vertical direction Z in the drawing. These teeth 17 enable the substrates W to be aligned and contained in a horizontal state arranged in the vertical direction Z.

Each tooth 17 may be configured to be able to support the substrate W and its shape is not limited. The shape of the tooth 17 includes a rectangular shape, a dogleg shape (V shape), a semicircular arc shape and the like in a planar view, for example. The tooth 17 has a shelf part formed so as to extend along the periphery of the substrate W and a substrate contact part which is formed on this shelf part and has a flat face to contact the substrate W.

Further, on the opening 3 side of the tooth 17, a position control step 18 is formed for controlling the position of the substrate W. By this position control step 18 and an inside wall part 19 of the side wall 21 which is enabled to come into contact with the substrate W on the back side (opposite side of the opening 3) of the container main body 2, the movement of the substrate W can be controlled in the forward and backward direction Y within the container main body 2.

The teeth 17 having such a configuration may be formed integrally together with the container main body 2 or the teeth 17 may be attached to the container main body 2 utilizing a fixing member or friction locking. By such teeth 17, the side periphery of the substrate W can be supported horizontally while having a high positional accuracy, and the substrate W is prevented from being inclined in the vertical direction Z and can be easily input or taken out by a robot fork.

On the outside face of a bottom plate (bottom part) in the container main body 2, a positioning part is formed for performing positioning against a predetermined apparatus (e.g., processing apparatus performing substrate processing). The positioning parts are provided at three locations and disposed to form a Y shape. Further, the positioning part has a V-shaped groove (concave part) formed. Here, the cross-sectional shape of the positioning part is not limited to the V shape but is formed in an M shape, an inverted V shape, an inverted Y shape, a concave oval shape, or the like.

On the outside face of a top panel 22 in the container main body 2, the robotic flange 7 is formed to have a rectangular shape in a planar view. This robotic flange 7 may be formed integrally with the container main body 2 or may be formed separately and configured to be detachable from the container main body 2. The substrate container 1 is transferred in a fabrication plant with the robotic flange 7 held by an automatic transfer mechanism called OHT (Overhead Hoist Transfer) which is not shown in the drawing.

Figure 6:
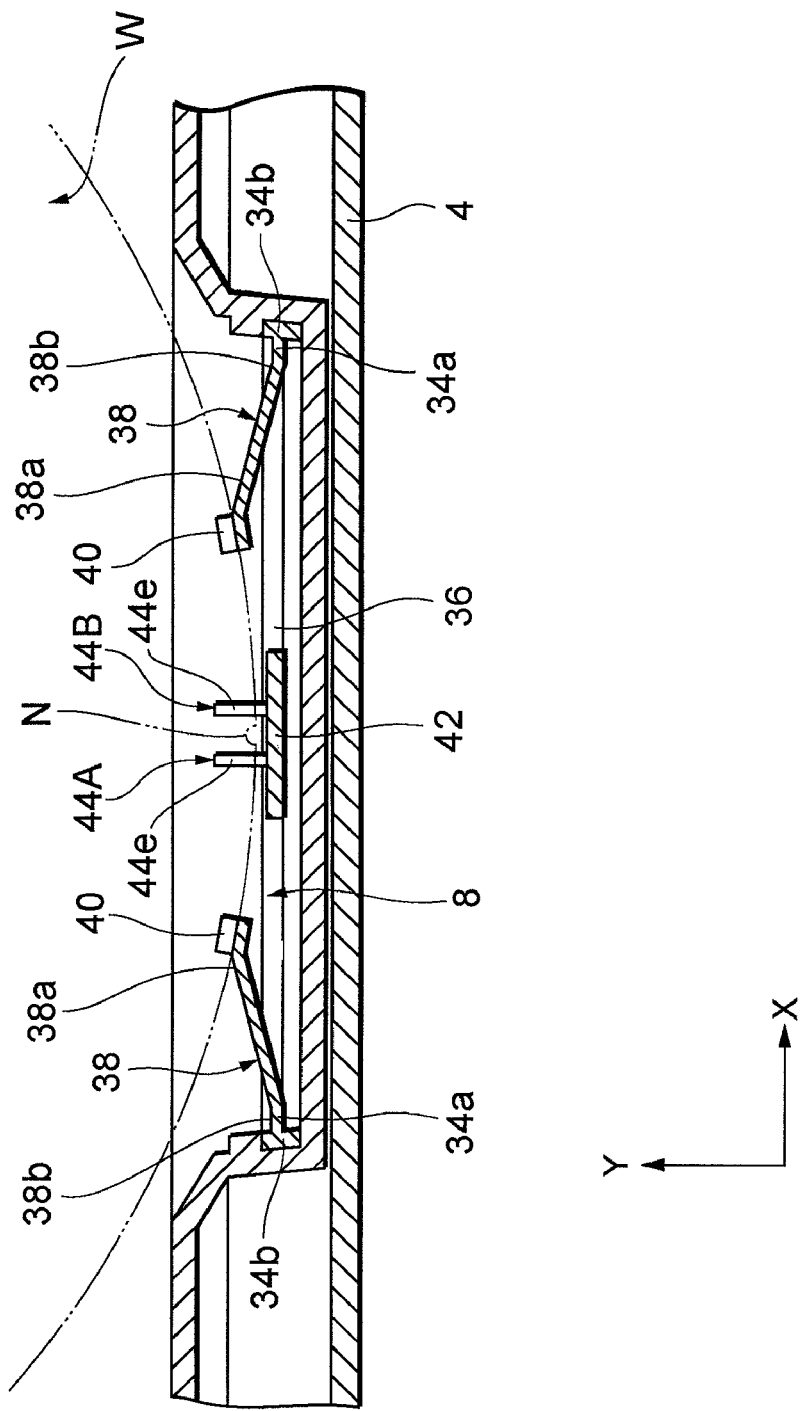
FIG. 6 is a cross-sectional view taken along the line VI-VI in FIG. 3.
Figure 7:
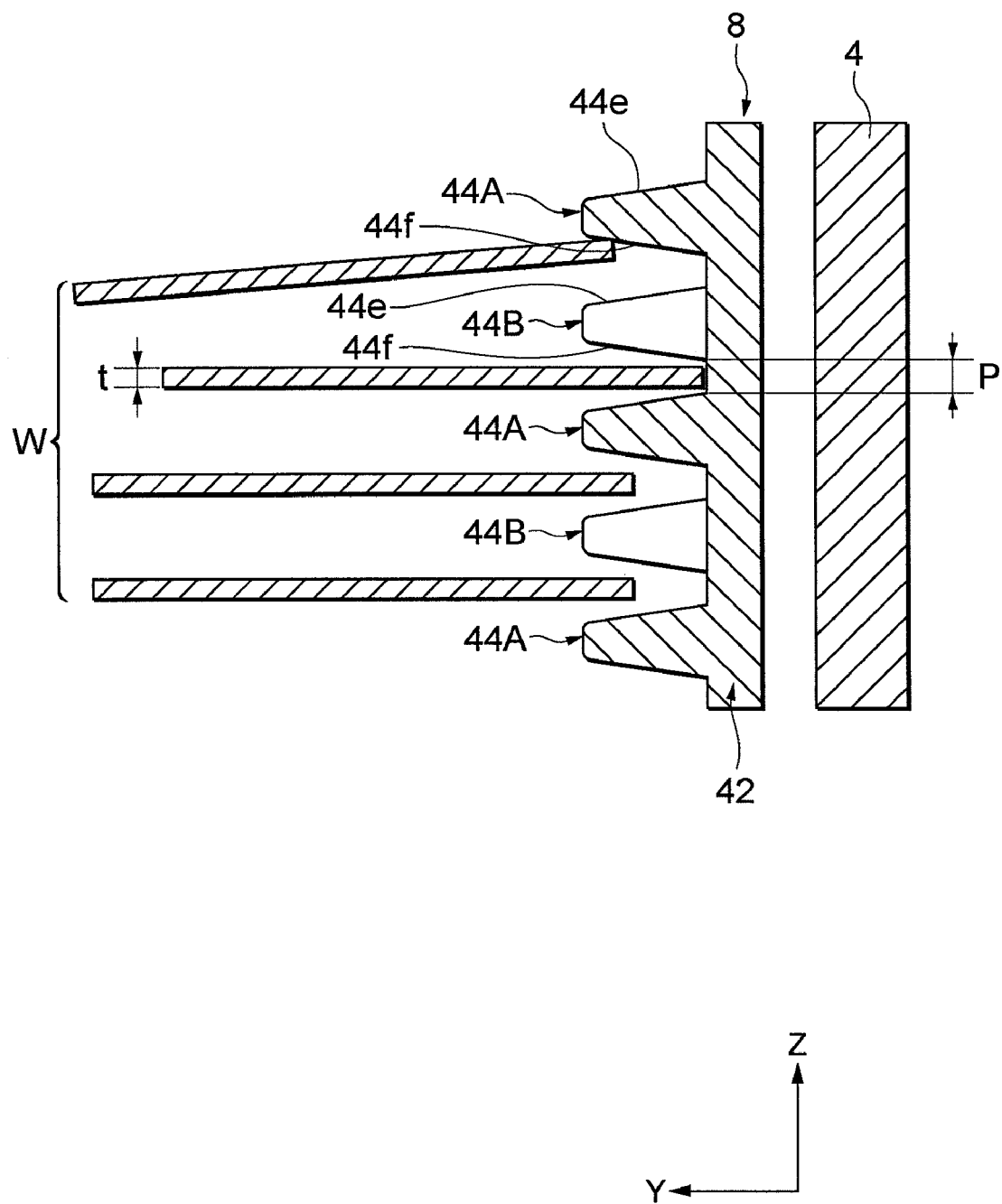
FIG. 7 is a partial cross-sectional view showing a cover attached to a container main body, a retainer attached to this cover, and a substrate retained within a substrate container.

Hereinafter, the retainer 8 will be described in detail. FIG. 3 is a rear view of the cover to which the retainer in FIG. 1 is attached, FIG. 4 is a perspective view of the retainer in FIG. 3, FIG. 5 is an enlarged front view of the retainer shown in FIG. 3, FIG. 6 is a cross-sectional view taken along the line VI-VI in FIG. 3, and FIG. 7 is a partial cross-sectional view showing the cover mounted on the container main body, the retainer attached to this cover, and the substrate retained within the substrate container.

Figure 4:
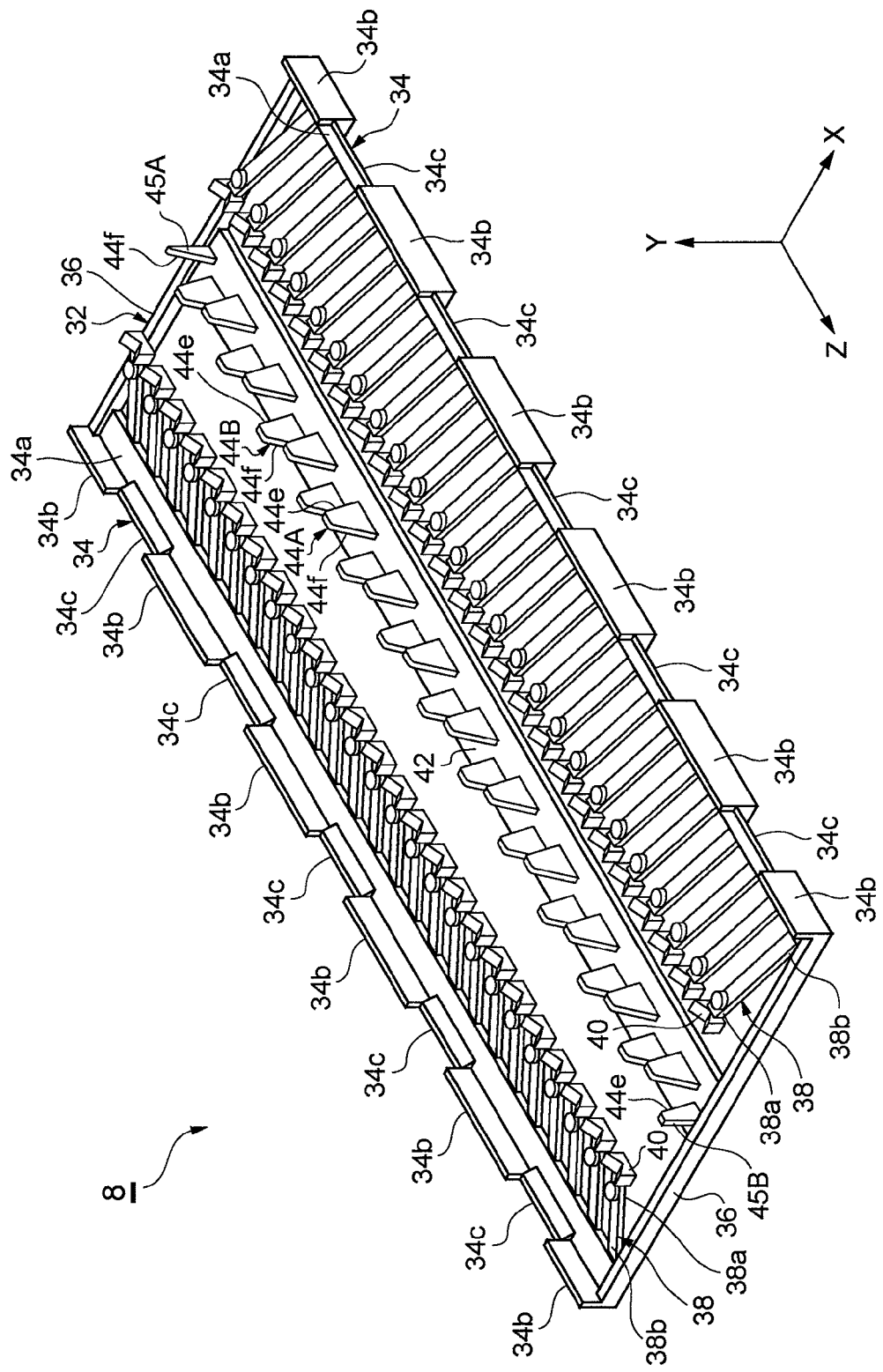
FIG. 4 is a perspective view of the retainer in FIG. 3.
Figure 5:
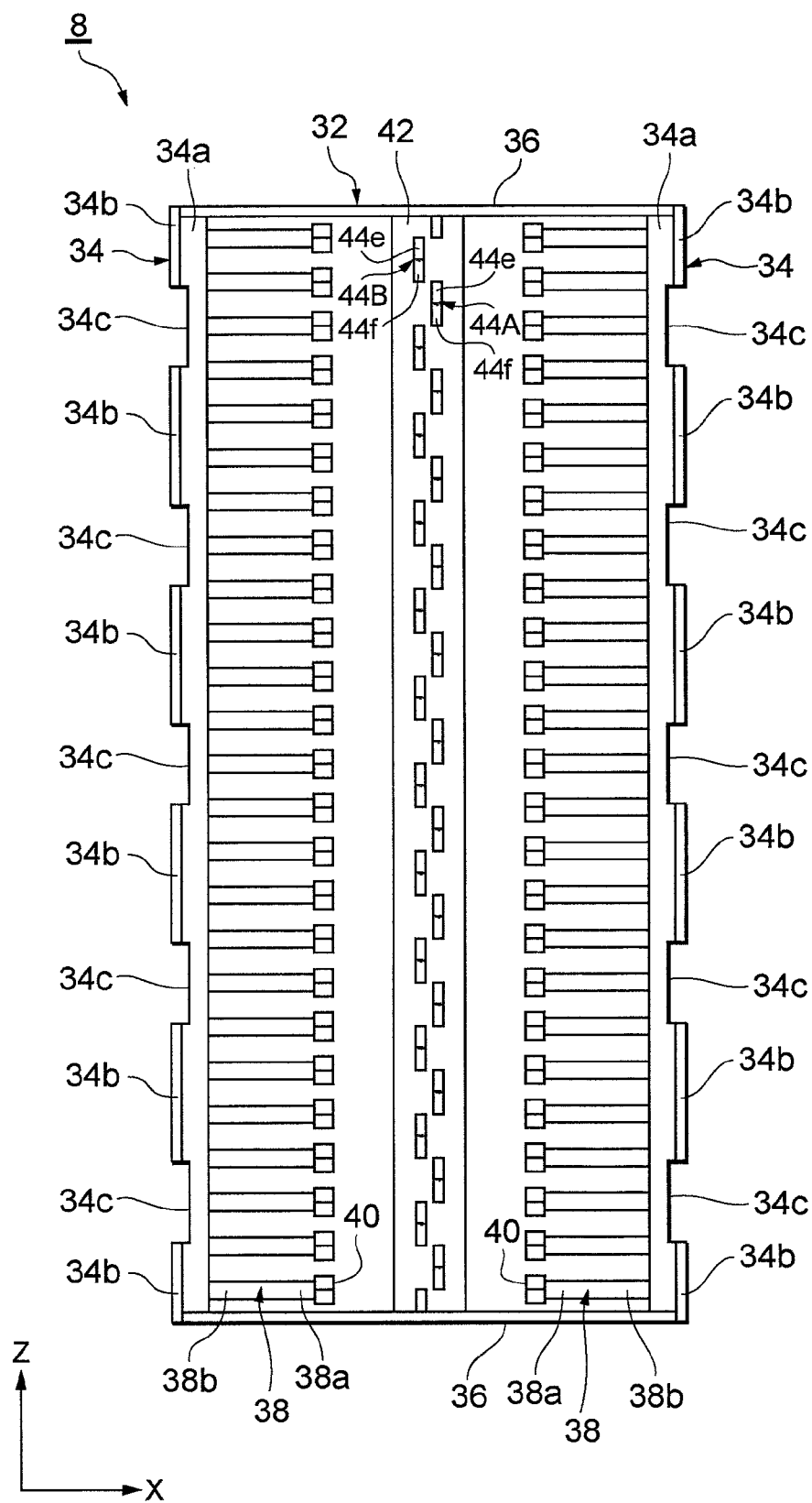
FIG. 5 is an enlarged front view of the retainer shown in FIG. 3.

As shown in FIG. 3 to FIG. 5, the retainer 8 is provided with a frame 32 having an outer shape of a rectangular shape, and the frame 32 includes a pair of vertical direction parts 34 which face each other and extend in the vertical direction Z and a pair of horizontal direction parts 36 which face each other and extend in the horizontal direction X.

The retainer 8 can be formed by synthetic resin such as polypropylene, polycarbonate, polyethylene terephthalate, polybutylene terephthalate, polyether ether ketone, polyacetal, and polyetherimide, and various kinds of thermoplastic elastomer such as polyester series thermoplastic elastomer, polyolefin series thermoplastic elastomer, polystyrene series thermoplastic elastomer, and polyurethane series thermoplastic elastomer. Further, these kinds of resin and thermoplastic elastomer can be added with additive agents in an appropriate quantity such as an antistatic agent, a conductive agent like carbon and metallic fiber, an ultraviolet light absorbent, a stiffener like glass fiber and carbon fiber.

As shown in FIG. 4 and FIG. 5, the vertical direction part 34 has a plate piece 34a which has a flat plate shape and extends in the vertical direction Z and plural side walls 34b protruding from the plate piece 34a in the forward and backward direction Y. The plate piece 34a is coupled to the pair of horizontal direction parts 36 at both ends of the plate piece 34a in the longitudinal direction and arranged to have the plate thickness direction in parallel to the forward and backward direction Y. The side wall 34b intersects the plate piece 34a at the outer end of the plate piece 34a along the vertical direction Z and is formed to have the plate thickness direction in parallel to the horizontal direction X, and the plural side walls 34b are formed in the vertical direction Z at an appropriate pitch. The plate piece 34a intersects the side wall 34b approximately at the center of the side wall 34b, for example, in the forward and backward direction Y. Further, at the part of the plate piece 34a where the side wall 34b is not formed, a cutout part 34c is formed to have a dent inside the plate piece 34a in the horizontal direction X. This cutout part 34c is fitted into a protruding part formed on the cover 4 and can fix the retainer 8 at an appropriate position when the retainer 8 is attached to the cover 4. Note that these side walls 34b and cutout parts 34c are preferably disposed symmetrically in the horizontal direction X. Further, these cutout parts 34c and the protruding parts formed on the cover have a function of a positioning part for performing positioning when the retainer is attached to the cover.

Further, in the retainer 8, as shown in FIG. 4 to FIG. 6, plural elastic pieces (plate springs) 38 are formed at an appropriate pitch in the vertical direction Z, each of which elastic pieces 38 protrudes inside from the plate piece 34a in the horizontal direction X and is capable of controlling the position of the substrate W in the forward and backward direction Y. The elastic piece 38 has a reed shape (horizontally long shape), for example, and its longitudinal direction extends in the horizontal direction X. As shown in FIG. 6, the elastic piece 38 is disposed to be inclined in the horizontal direction X such that a head part 38a side is positioned inside the substrate container 1 from a base part 38b side coupled to the plate piece 34a. Further, the elastic piece 38 is disposed at a position corresponding to the position of the substrate W in the vertical direction Z and also disposed symmetrically in the horizontal direction.

At the head part 38a of the elastic piece 38, there is provided a holding part 40 which forms an approximately rectangular solid and has a holding groove holding the substrate W on a face facing the substrate W. The holding groove of the holding part 40 has a V shape, for example, in a cross-section intersecting the substrate W and is formed so as to travel along the periphery of the substrate W. Then, faces forming this holding groove are inclined in the vertical direction Z and can guide the substrate W to an appropriate position in the vertical direction Z. Note that the face forming the holding groove may be curved and the holding groove having the V-shaped cross-section may be replaced by a holding groove having a U-shaped cross-section, for example.

Further, the retainer 8 is provided with a coupling piece 42 which extends in the vertical direction Z and is coupled to the horizontal direction parts 36 at both ends of the coupling piece 42 in the longitudinal direction. This coupling piece 42 forms a flat plate shape having the plate thickness direction in parallel to the forward and backward direction Y and disposed so as to have the principal face facing the peripheral of substrate W. Further, the coupling piece 42 is disposed in the center of the retainer 8 in the horizontal direction X.

Further, on the principal face of the coupling piece 42 on the substrate W side, there are formed plural convex rib pieces (protruding parts) 44A and 44B protruding to the substrate W side. This convex rib piece 44A or 44B forms a chevron shape (approximate trapezoidal shape) in a side view, for example. Each of these convex rib pieces 44A and 44B is disposed between the substrates W neighboring each other in the vertical direction Z. The convex rib piece 44A or 44B has a flat plate shape and is disposed so as to have the plate thickness direction in parallel to the horizontal direction X and the end faces in the vertical direction Z forms inclined faces 44e and 44f, respectively, inclined in the direction intersecting the substrate W. That is, the inclined face 44e (first inclined face) which is the upper end face of the convex rib piece 44A or 44B is inclined such that the head side (backward side of the substrate container 1) of the convex rib piece 44A or 44B is positioned lower than the base side (coupling piece 42 side) of the convex rib piece 44A or 44B in the vertical direction Z. Further, the inclined face 44f (second inclined face) which is the lower end face of the convex rib piece 44A or 44B is inclined such that the head side (backward side of the substrate container 1) of the convex rib piece 44A or 44B is positioned higher than the base side of the convex rib piece 44A or 44B in the vertical direction Z.

Further, the convex rib pieces 44A and 44B neighboring each other in the vertical direction Z are disposed at positions different from each other in the horizontal direction X. Specifically, the convex rib piece 44A is disposed on the right side of the center of the substrate container 1 in the drawing (refer to FIG. 5) and the convex rib piece 44B is disposed on the left side of the center of the substrate container 1 in the drawing. That is, as shown in FIG. 6, the convex rib pieces 44A and 44B are separated in the horizontal direction X and disposed at positions which do not overlap with the notch N of the substrate W when viewed in the vertical direction Z. Further, the convex rib pieces 44A disposed on the right side and the convex rib pieces 44B disposed on the left side are disposed alternately in the vertical direction Z and arranged in a line, respectively, as shown in FIG. 5.

Further, in the retainer 8, as shown in FIG. 7, the inclined faces 44e and 44f of the convex rib piece 44A or 44B are disposed at positions which do not contact the substrate W in the normal state in which the substrates W are aligned and disposed at appropriate positions. Specifically, the pitch P between the convex rib pieces 44A and 44B neighboring each other in the vertical direction Z is determined to be larger than the plate thickness t of the substrate W. Further, as shown in FIG. 4, the convex rib piece 45A disposed at the highest stage has a half-broken shape in the vertical direction Z and has the inclined face 44f facing downward, and the convex rib piece 45B disposed at the lowest stage has a half-broken shape in the vertical direction Z and has the inclined face 44e facing upward. Further, as shown in FIG. 6, the head part of the convex rib piece 44A or 44B is provided so as to overlap with a part of the periphery of substrate W when viewed in the vertical direction Z in the normal state.

Figure 8:
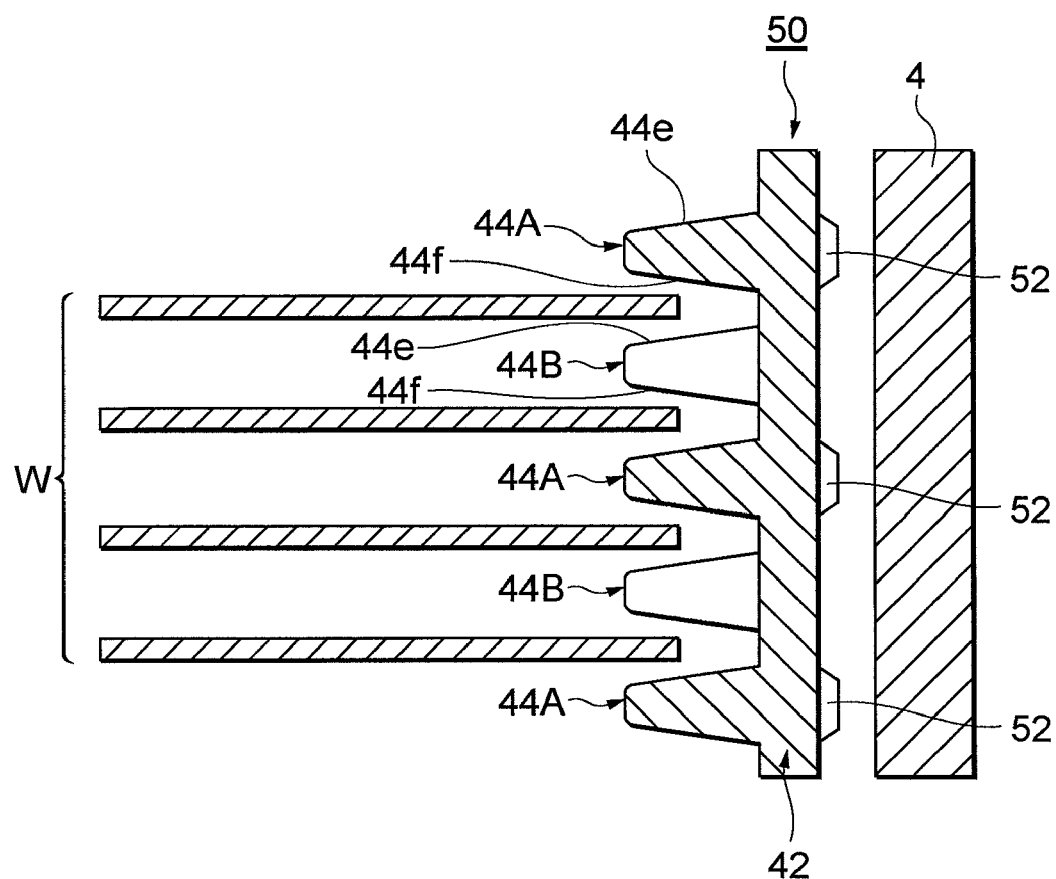
FIG. 8 is a partial cross-sectional view showing a retainer according to a second embodiment of the present invention together with the cover and the substrate

Next, there will be explained the position control of the substrate W by the retainer 8 configured in such a manner. In the normal state, the substrate W is supported by the teeth 17 at the periphery in the horizontal direction X as shown in FIG. 2, and retained horizontally within the substrate container 1. At this time, the substrate W is controlled not to move forward by the position control step 18 and not to move backward by the inside wall face parts 19 of the side wall 21. Further, in this normal state, the substrate W is held by the holding part 40 supported by the elastic piece 38 at the periphery on the forward side and controlled not to move forward as shown in FIG. 6. Then, as shown in FIG. 8, the substrate W is disposed between the convex rib pieces 44A and 44B in the vertical direction Z and has a state without contacting the convex rib pieces 44A and 44B.

Here, in a case in which a force is applied to move the substrate W forward, such as a case in which the substrate container 1 is inclined to the forward side (retainer 8 side), for example, the substrate W is forced to move backward by the restoring force of the elastic piece 38 and returns to the same position as that in the normal state.

Further, as shown in FIG. 7, when the substrate W moves forward, the substrate W contacts the principal face of the coupling piece 42 in the retainer 8 on the substrate W side and is forced to move backward by the restoring force of the elastic piece 38 and returns to the same position as that in the normal state, as described above.

Further, when the substrate W is inclined upward on the forward side, the substrate W contacts the inclined face 44f of the convex rib piece 44A or 44B in the coupling piece 42 of the retainer 8. Then, the substrate W is controlled not to move further by the inclined face 44f and guided to an intermediate position between the convex rib pieces 44A and 44B neighboring each other in the vertical direction Z, and the substrate returns to the same position as that in the normal state.

Similarly, when the substrate W is inclined downward on the forward side, the substrate W contacts the inclined face 44e of the convex rib piece 44A or 44B in the coupling piece 42 of the retainer 8. Then, the substrate W is controlled not to move further by the inclined face 44e and guided to an intermediate position between the convex rib pieces 44A and 44B neighboring each other in the vertical direction Z, and the substrate returns to the same position as that in the normal state.

In the substrate container 1 provided with such a retainer 8, the position of the substrate W in the forward and backward direction can be controlled by the elastic piece 38 protruding inside from the vertical direction part 34 of the frame 32, and thereby it is possible to return the substrate W to the original position with the elastic piece 38 even when the position of the substrate W is shifted. Further, the retainer 8 is provided with the coupling piece 42 which extends in the vertical direction Z and is coupled to the horizontal direction parts 36 of the frame 32 at both ends of the coupling piece 42 in the longitudinal direction (vertical direction Z in the drawing) and this coupling piece 42 has the plural convex rib pieces 44A and 44B formed to protrude inside the substrate container 1. This convex rib piece 44A or 44B is configured to have the inclined faces 44e and 44f which are enabled to come into contact with the periphery of the substrate W, and thereby it is possible to guide the substrate W easily to the same position as that in the normal state and control the position of the substrate W while reducing the friction of the substrate W.

Further, the convex rib piece 44A or 44B is disposed between the substrates W neighboring each other in the vertical direction Z, and thereby one rib piece 44A or 44B can guide two substrates W neighboring each other in the vertical direction Z. As a result, it is possible to reduce the number of components and realize a simple configuration to suppress production cost.

Further, the convex rib pieces 44A and 44B are disposed so as to form the space P larger than the plate thickness t of the substrate W in the vertical direction Z, and thereby the substrate W does not contact the convex rib piece 44A or 44B in the normal state in which the substrates are aligned and disposed and the substrate W contacts the convex rib piece 44A or 44B only when the substrate W is shifted. By such a disposition, it is possible to reduce the friction between the substrate W and the convex rib piece 44A or 44B and to suppress the particle generation.

Further, the convex rib pieces 44A and 44B, which are provided on both sides sandwiching the substrate W in the vertical direction Z, are disposed at positions different from each other in the horizontal direction X, and thereby the substrate W cannot be caught between the convex rib pieces 44A and 44B neighboring each other in the vertical direction Z.

Figure 13:
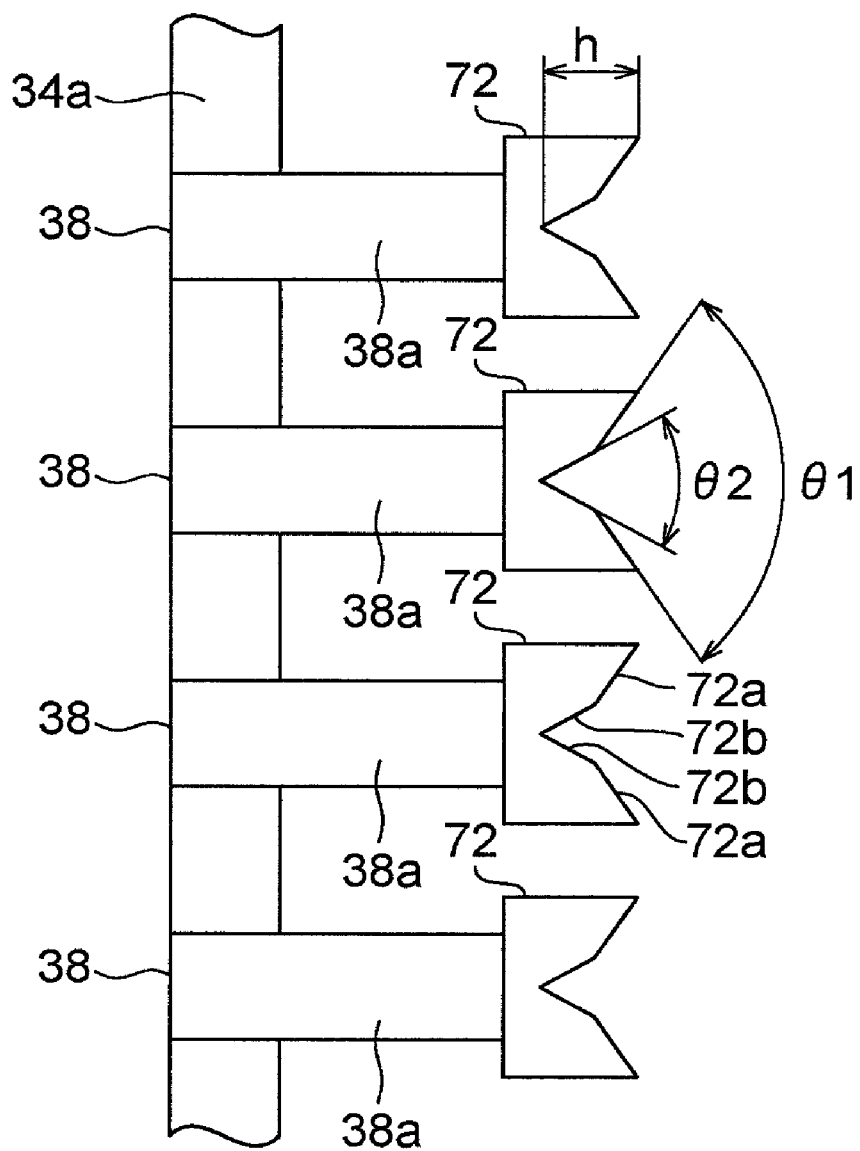
FIG. 13 is a partial side view showing a retainer according to a modified example of the first embodiment of the present invention.

Here, a retainer 70 according to a modified example of the first embodiment will be described with reference to FIG. 13. A holding groove in a holding part 72 provided at the head part 38a of the elastic piece 38 can be configured to have a shape including a two-stage inclined face as shown in FIG. 13 as well as the V shape as in the holding groove of the holding part 40 in the first embodiment. In this case, an angle θ1 formed by inclined faces 72a facing each other on the opening side of the holding groove is preferably set in a range of 100° to 120° for controlling the position of the substrate W. When the angle θ1 is 100° or larger, the substrate W shifted from the center can be guided into the holding groove in a wide range. Further, when the angle θ1 is 120° or smaller, the substrate W can be guided securely into the holding groove without being caught in the middle of the inclined face.

Further, an angle θ2 formed by inclined faces 72b at the bottom of the holding groove is preferably set in a range of 35° to 55° for being able to hold the substrate W stably. When the angle θ2 is 35° or larger, the substrate W can be prevented from being pulled out by the retainer 70 when the substrate W is caught in the holding groove and the cover 4 is released. Further, when the angle θ2 is 55° or smaller, the substrate W can be prevented from being put out easily from the holding groove by vibration or the like.

Further, the depth h of the holding groove is preferably determined to be in a range of 1.5% to 3.0% of the substrate radius. For example, for the substrate W having a radius of 150 mm (diameter of 300 mm), the depth h is set in a range of 2.25 mm to 4.5 mm. When the depth h is 2.25 mm or larger, the substrate W can be prevented from being put out easily from the holding groove by vibration or the like. When the depth is 4.5 mm or smaller, the holding part 72 is prevented from becoming so large as to protrude from the surface of the cover 4 and also the elastic piece 38 is prevented from losing elasticity.

Next, a retainer according to a second embodiment of the present invention will be described with reference to FIG. 8. FIG. 8 is a partial cross-sectional view showing the retainer according to the second embodiment of the present invention together with the cover and the substrate. A difference of this retainer 50 according to the second embodiment from the retainer 8 according to the first embodiment is that the retainer 50 has a receiving part 52 protruding forward from the coupling piece 42.

Specifically, the receiving part 52 is formed on the principal face of the coupling piece 42 facing the cover 4 and protrudes toward the cover 4. This receiving part 52 has a trapezoidal shape in a side view, for example, and the plural receiving parts 52 are provided at an appropriate pitch in the vertical direction. In the vertical direction Z, the receiving part 52 is provided at a position corresponding to that of the convex rib piece 44A. Further, the receiving part 52 is disposed at the center of the coupling piece 42 in the horizontal direction X. Note that the shape of the receiving part 52 is not limited and may be a shape enabling the receiving part 52 to contact the cover 4.

Such a retainer 50 according to the second embodiment also provides the same function and effect as that of the first embodiment. Further, the retainer 50 of the second embodiment has the receiving part 52 formed to protrude forward from the coupling piece 42, and thereby the forward movement of the coupling piece 42 can be controlled by the contact of the receiving part 52 with the cover 4. As a result, it is possible to control the forward movement of the coupling piece 42 and to control the movement of the substrate W more preferably, and thereby it is possible to reduce the friction of the substrate W. Note that the receiving part 52 is preferably configured to protrude to the forward side (cover 4 side) farther than the side wall 34b of the retainer 50. Thereby, the movement amount of the coupling piece 42 in the forward and backward direction Y can be reduced further more. Further, by changing the height of the receiving part 52 (length in the forward and backward direction Y), it is possible to preferably adjust the position of the coupling piece 42 in the forward and backward direction. Further, the receiving part 52 may have a circular shape, a rectangular shape, or flat plate shape in a view in the forward and backward direction Y, and may have another shape.

Figure 9:
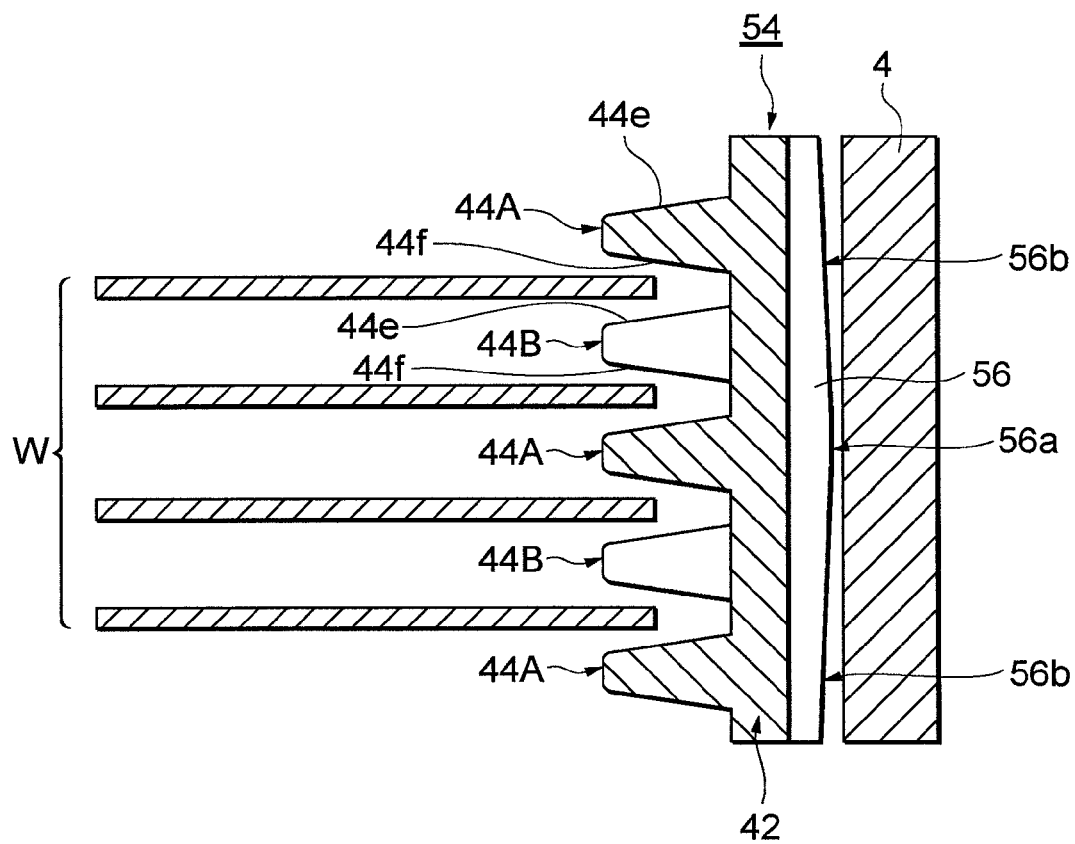
FIG. 9 is a partial cross-sectional view showing a retainer according to a third embodiment of the present invention together with the cover and the substrate.

Next, a retainer according to a third embodiment of the present invention will be described with reference to FIG. 9. FIG. 9 is a partial cross-sectional view showing the retainer according to the third embodiment of the present invention together with the cover and the substrate. A difference of this retainer 54 according to the third embodiment from the retainer 50 according to the second embodiment is that the shape of a receiving part 56 is different.

Specifically, the receiving part 56 is formed on the principal face of the coupling piece 42 facing the cover 4 and protrudes toward the cover 4. This receiving part 56 has the highest height (length in the forward and backward direction Y) at the center part 56a in the vertical direction Z and has inclined sides 56b formed to be inclined toward both end parts in the vertical direction Z. By such a configuration, the position of the center part 56a, which has a largest movement amount in the forward and backward direction Y, is preferably controlled. Note that, instead of the linearly-inclined side 56b in a side view, a curved shape may be formed.

Figure 10:
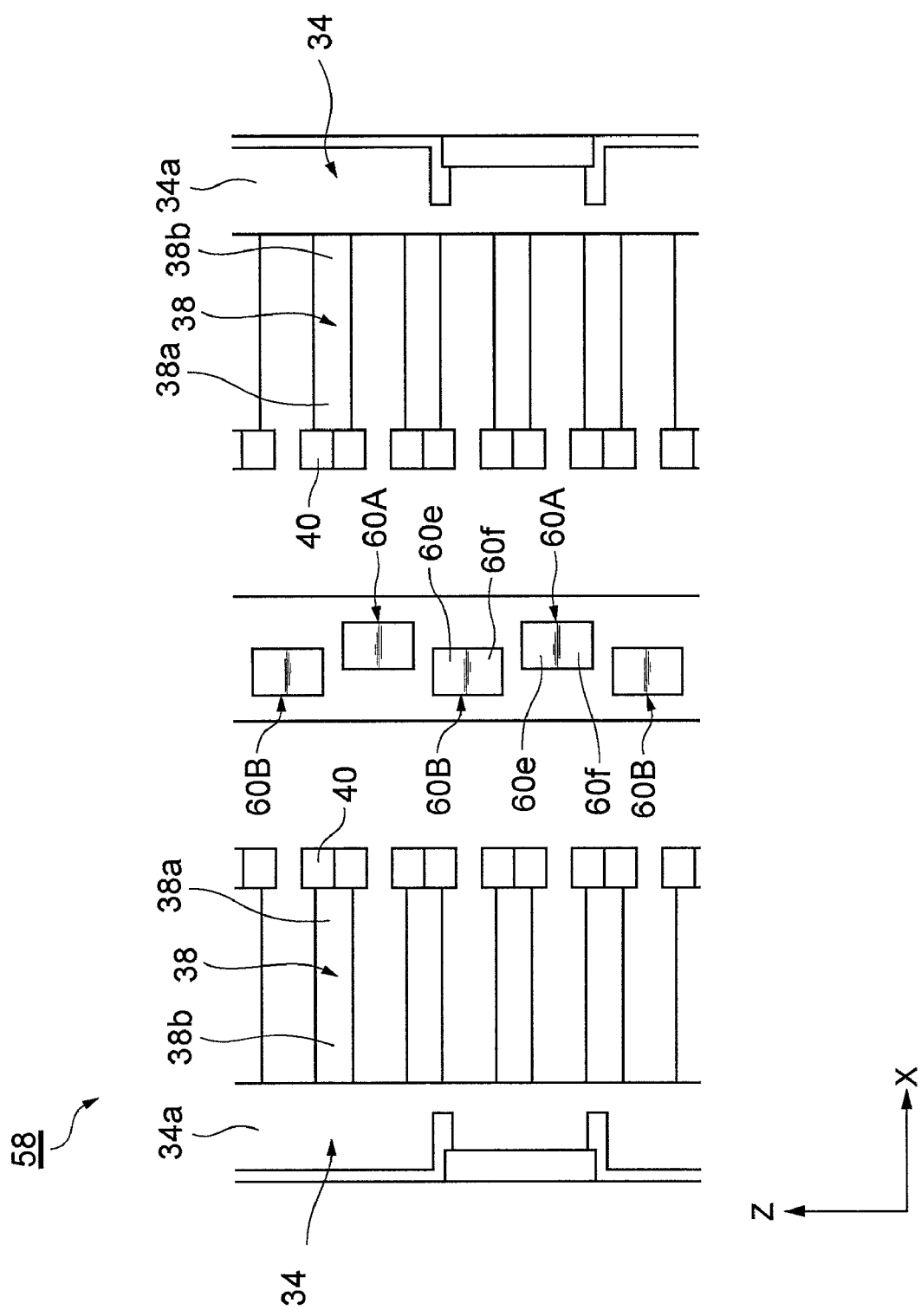
FIG. 10 is a partial front view showing a retainer according to a fourth embodiment of the present invention.

Next, a retainer according to a fourth embodiment of the present invention will be described with reference to FIG. 10. FIG. 10 is a partial front view of the retainer according the fourth embodiment of the present invention. Note that the front face of the retainer means the face on the substrate W side. A difference of the retainer 58 according to the fourth embodiment from the retainer 8 according to the first embodiment is that the retainer 58 includes convex rib pieces (protruding parts) 60A and 60B which have different shapes and positions from those of the convex rib pieces 44A and 44B, respectively.

Specifically, each of the convex rib pieces 60A or 60B of the retainer 58 according to the fourth embodiment is formed into a block shape and has a wider width than the convex rib piece 44A or 44B of the first embodiment in the horizontal direction X. Note that the side shape of the convex rib piece 60A or 60B is the same as that of the convex rib piece 44A or 44B and formed in a chevron shape (approximate trapezoidal shape), for example. Then, the end faces in the vertical direction Z configure inclined faces 60e and 60f, respectively, which are inclined in the direction intersecting the substrate W. That is, the inclined face 60e (first inclined face) which is the upper end face of the convex rib piece 60A or 60B is inclined such that the head side (backward side of the substrate container 1) of the convex rib piece 60A or 60B is positioned lower than the base side (coupling piece 42 side) of the convex rib piece 60A or 60B. Further, the inclined face 60*f* (second inclined face) which is the lower end face of the convex rib piece 60A or 60B is inclined such that the head side (backward side of the substrate container 1) of the convex rib piece 60A or 60B is positioned higher than the base side of the convex rib piece 60A or 60B.

Further, the convex rib pieces 60A and 60B are disposed in two lines, respectively, along the vertical direction Z and the convex rib piece 60A is disposed on the right side in the drawing and the convex rib piece 60B is disposed on the left side in the drawing. Then, the convex rib pieces 60A and 60B are disposed so as to partially overlap with each other in the horizontal direction X when viewed in the vertical direction Z. For example, the convex rib pieces 60A and 60B are disposed so as to overlap with each other approximately by half in the horizontal direction X. Further, each of the respective inclined faces 60*e* and 60*f* of the convex rib pieces 60A and 60B is preferably formed in a wider range than the width of the notch N (refer to FIG. 6) formed on the substrate W in the horizontal direction X. The retainer 8 of the fourth embodiment configured in this manner also provides the same function and effect as the retainer 8 of the first embodiment.

Figure 11:
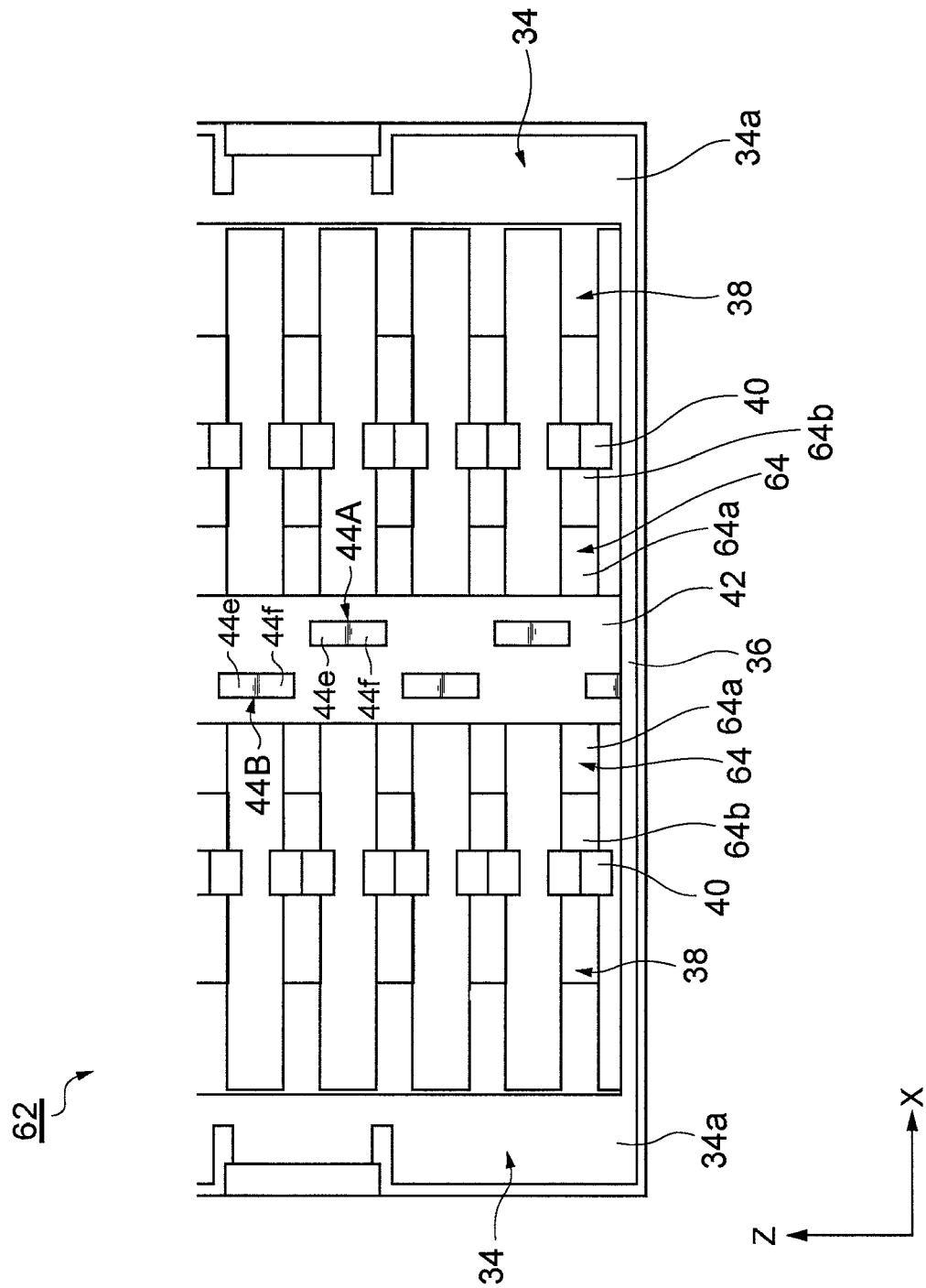
FIG. 11 is a partial front view showing a retainer according to a fifth embodiment of the present invention.

Next, a retainer according to a fifth embodiment of the present invention will be described with reference to FIG. 11. FIG. 11 is a partial front view of the retainer according to the fifth embodiment of the present invention. A difference of this retainer 62 according to the fifth embodiment from the retainer 8 according to the first embodiment is that a structure supporting the holding part 40 is different and the retainer 62 has the holding part 40 supported by a fixed-fixed beam structure replacing the holding part 40 supported by the cantilever structure.

The retainer according to the fifth embodiment is provided with an elastic coupling piece 64 supporting the holding part 40 from the inside in the horizontal direction X. The elastic coupling piece 64 extends in the horizontal direction X and one end part 64*a* is coupled to the coupling piece 42 and the other end part 64*b* is coupled to the holding part 40. Then, the holding part 40 is supported by the elastic piece 38 and the elastic coupling piece 64 on both sides in the horizontal direction X. The retainer 62 of the fifth embodiment configured in this manner also provides the same function and effect as the retainer 8 of the first embodiment.

Figure 12:
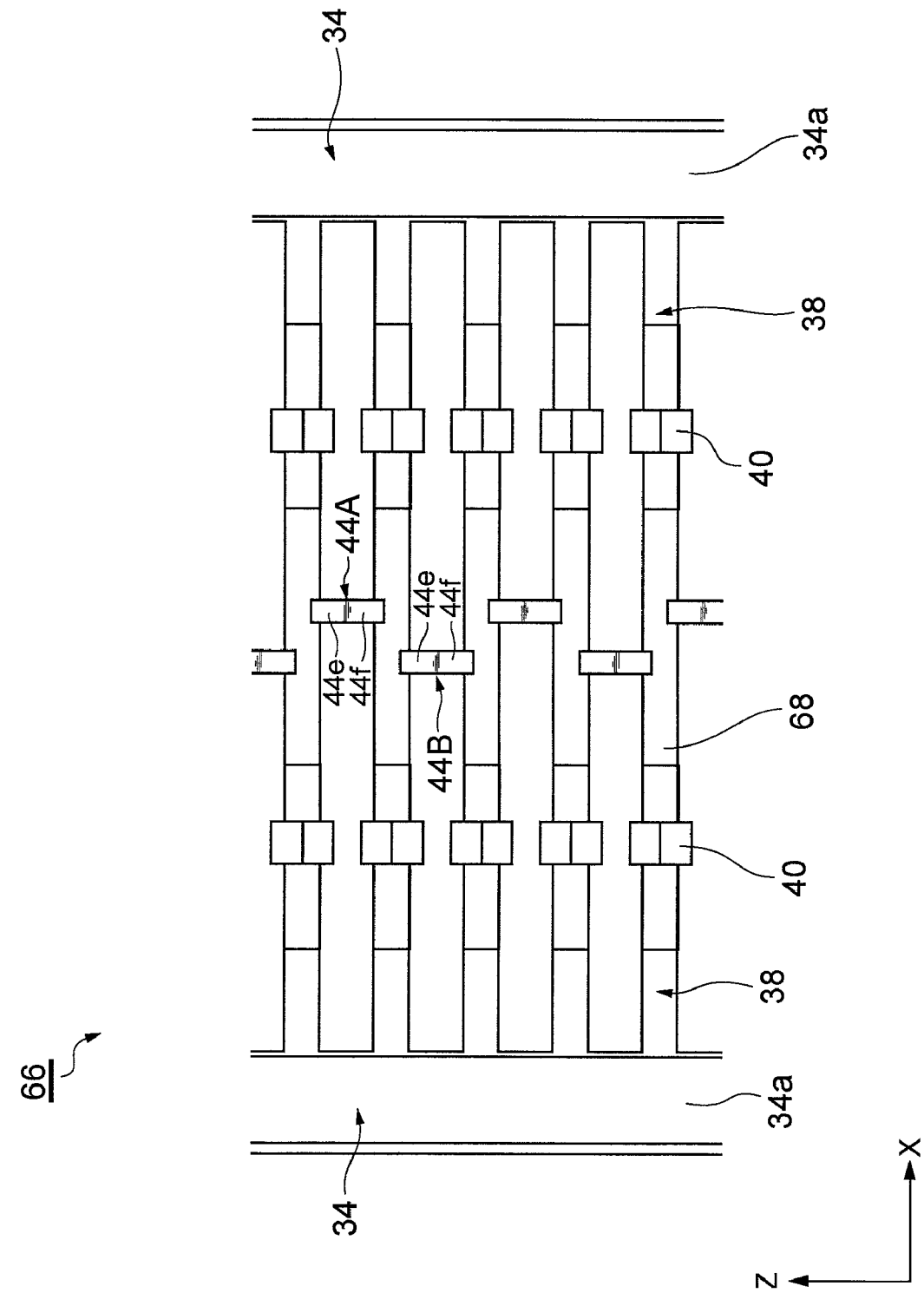
FIG. 12 is a partial front view showing a retainer according to a modified example of the present invention.

Next, a retainer according to a modified example of the present invention will be described with reference to FIG. 12. FIG. 12 is a front view of the retainer according to the modified example of the present invention. The difference of the retainer 66 according to the modified example from the retainer 8 according to the first embodiment is that the retainer 66 is provided with an elastic coupling piece 68 coupling the holding parts 40 neighboring each other in the horizontal direction X replacing the coupling piece 42 and that the convex rib piece 44A or 44B is fixed across the two elastic coupling pieces 68 neighboring each other in the vertical direction. In such a configuration, the receiving part (52 or 56) protruding toward the cover 4 from the elastic coupling piece 68 is preferably formed for controlling the forward movement of the convex rib piece 44A or 44B.

While the present invention has been explained hereinabove using the embodiments thereof, the present invention is not limited to the above described embodiments. The substrate container of the present invention has been explained as the container to contain a semiconductor wafer in the above embodiments, but the substrate to be contained is not limited to the semiconductor wafer and may be another precise substrate represented by a mask glass. Further, the size of the substrate to be contained is not limited to 300 mm and may be another size such as 450 mm, for example. Further, the number of substrates to be contained is not limited to 1 to 25 and may be 26 or larger.

Further, while the substrate container 1 has the retainer 8 attached to the back side of the cover 4 in the above embodiments, the attachment position of the retainer 8 may be the inside face of the side wall 21 in the container main body 2 or the inside face of the back side wall.

Further, while the positioning protrusions or the positioning concaves which are the positioning parts for attaching the retainer 8 to the cover 4 are disposed at symmetrical positions in the horizontal direction in the vertical direction part 34 of the frame 32, the positioning parts may be formed asymmetrically in the horizontal direction. When the positioning parts are formed asymmetrically in the horizontal direction in this manner, the directionality in the vertical direction Z can be found when the retainer 8 is attached and thereby the substrate W is made possible to accurately contact the wall face forming the holding groove of the holding part 40. Further, even in the configuration providing the symmetric positioning parts in the horizontal direction, an attachment error in the vertical direction may be prevented by the additional formation of an asymmetric positioning part.

Further, the positioning part of the cover or the retainer and the latching hook of the retainer may be formed not only on one side wall but also on the other side wall. Further, by a configuration providing a bending part which can be bent upward on a part of the frame, it is possible to easily perform the attachment or detachment of the retainer.

Further, a receiving part may be formed on the back face (principal face on the retainer side) of the cover 4 instead of the receiving parts 52 and 56 provided on the back sides of the retainers 50 and 54, respectively, for controlling the forward movement of the coupling piece 42 and the convex rib pieces 44A and 44B.

EXAMPLES

Next, the present invention will be described further in detail using examples, but the present invention is not limited to the examples.

Example 1

First, the substrate container 1 provided with the retainer 8 of the first embodiment (refer to FIG. 4) was prepared and 25 substrates W were contained in this substrate container 1. Each of the contained substrates W was supported horizontally by the teeth 17.

Subsequently, the bottom face of the substrate container 1 containing each of the substrates W in this manner was lifted from a reference plane in 10 cm, and the substrate container 1 was dropped vertically in a state keeping the bottom face downward and the run-off of the substrate W from the retainer 8 and the breakage of the substrate W were confirmed. Further, the substrate container 1 was similarly dropped at a drop height which was increased every 10 cm until the run-off of the substrate W from the retainer 8 or the breakage of the substrate W was occurred, and a bearable maximum drop height was confirmed.

Example 2

The substrate container provided with the retainer 70, which was the modified example of the first embodiment and included the holding part 72 (refer to FIG. 13) having the two-stage inclined faces 72a and 72b in the holding groove, was prepared, and 25 substrates W were contained in the substrate container the same as in Example 1. After that, the drop test the same as that in Example 1 was carried out for this substrate container.

Example 3

The substrate container provided with the retainer 50 of the second embodiment (refer to FIG. 8) was prepared and 25 substrates W were contained in the substrate container the same as in Example 1. After that, the drop test the same as that in Examples 1 and 2 was carried out for this substrate container.

Example 4

The substrate container provided with the retainer 54 of the third embodiment (refer to FIG. 9) was prepared and 25 substrates were contained in this substrate container the same as in Example 1. After that, the drop test the same as that in Examples 1 to 3 was carried out for this substrate container.

Example 5

The substrate container provided with the retainer 58 of the fourth embodiment (refer to FIG. 10) was prepared and 25 substrates were contained in this substrate container the same as in Example 1. After that, the drop test the same as that in Examples 1 to 4 was carried out for this substrate container.

Example 6

The substrate container provided with the retainer 62 of the fifth embodiment (refer to FIG. 11) was prepared and 25 substrates were contained in this substrate container the same as in Example 1. After that, the drop test the same as that in Examples 1 to 5 was carried out for this substrate container.

Comparison Example

The coupling piece 42 was removed from the retainer 8 of the first embodiment for a comparison retainer and the substrate container provided with this comparison retainer was prepared. After that, the drop test the same as that in Examples 1 to 6 was carried out for this substrate container.

Table 1 shows the results of the drop tests in Example 1 to Example 6 and the result of the drop test in Comparison example.

TABLE 1

| Drop Height (cm) | Example 1 | Example 2 | Example 3 | Example 4 | Example 5 | Example 6 | Comparison example |
|---|---|---|---|---|---|---|---|
| 10 | Good | Good | Good | Good | Good | Good | Good |
| 20 | Good | Good | Good | Good | Good | Good | Good |
| 30 | Good | Good | Good | Good | Good | Good | Run-off |
| 40 | Good | Good | Good | Good | Good | Good | — |
| 50 | Good | Good | Good | Good | Good | Good | — |
| 60 | Good | Good | Good | Good | Good | Good | — |
| 70 | Good | Good | Good | Good | Good | Good | — |
| 80 | Run-off | Good | Run-off | Good | Run-off | Run-off | — |
| 90 | — | Run-off | — | Run-off | — | — | — |

As apparent from Table 1, in the substrate container provided with the comparison retainer (retainer without the coupling piece 42), the substrate W ran off the holding groove in the drop test at a drop height of 30 cm and the breakage was occurred because of the run-off on the substrate W. On the other hand, in each of the substrate containers of Examples 1 to 6, the substrate W did not run off the holding groove in the drop test even at a drop height of 70 cm to 80 cm ("Good" in the table means that the substrate W did not run off). Accordingly, the retainer according to the present embodiment can bear the drop height more than three times higher than the comparison retainer and can retain the substrate W more stably.

REFERENCE SIGNS LIST

1: Substrate container, 2: Container main body, 3: Opening, 4: Cover, 8, 50, 54, 58, 62, 70: Retainer, 32: Frame, 34: Vertical direction part, 36: Horizontal direction part, 38: Elastic piece, 40, 72: Holding Part, 42: Coupling piece, 44A, 44B, 60A, 60B: Convex rib piece (Protrusion), 44e, 60e: Inclined face (First inclined face), 44f, 60f: Inclined face (Second inclined face), 52, 56: Receiving part.

The invention claimed is:

1. A retainer provided to a substrate container containing a plurality of substrates, for retaining the plurality of substrates aligned and supported at regular intervals with a plate thickness direction in a vertical direction, the retainer comprising:
   a frame having a pair of vertical direction parts each extending in the vertical direction and a pair of horizontal direction parts each extending in a horizontal direction which intersects the pair of vertical direction parts;
   an elastic piece protruding inside from the vertical direction part and having a holding part configured to control a position of one of the plurality of substrates;
   a coupling piece extending in the vertical direction and having both ends thereof coupled to the horizontal direction parts; and
   a plurality of protruding parts protruding inside the substrate container from the coupling piece and having an inclined face formed to be inclined in a direction intersecting the one substrate and enabled to come into contact with a periphery of the one substrate,
   wherein the one substrate is disposed between one of the plurality of protruding parts and another of the plurality of protruding parts, adjacent to the one substrate in the vertical direction, the inclined face comprising:
      a first inclined face formed on an upper end of the one of the plurality of protruding parts and configured to come into contact with the one substrate; and
      a second inclined face formed on a lower end of the one of the plurality of protruding parts and configured to come into contact with another of the plurality of substrates,
      wherein the first inclined face and the second inclined face do not contact the plurality of substrates when the plurality of substrates are in a normal state,
   wherein the plurality of protruding parts are provided on both sides of the one substrate in the vertical direction, and
   wherein the plurality of protruding parts provided on both sides of the one substrate is disposed to form a space larger than a plate thickness of the substrate in the vertical direction.

2. The retainer according to claim 1, wherein the protruding parts provided on both sides of the substrate are disposed at positions different from each other in the horizontal direction.

3. The retainer according to claim 1, further comprising:
a receiving part protruding outward from the coupling piece and enabled to come into contact with a wall to which the frame is attached, for controlling movement of the coupling piece.

4. The retainer according to claim 3, wherein the receiving part is formed in a center of the coupling piece and protrudes outside the frame on the wall side.

5. A substrate container, comprising:

a container main body having an opening and containing a substrate;

a cover closing the opening; and the retainer according to claim 1, the retainer being attached to an inside wall of the container main body or the cover.

* * * * *